United States Patent [19]

Chisholm

[11] 4,206,543
[45] Jun. 10, 1980

[54] PIN INSERTION TOOL

[75] Inventor: William M. Chisholm, Midlothian, Va.

[73] Assignee: Western Electric Company, Inc., New York, N.Y.

[21] Appl. No.: 965,008

[22] Filed: Nov. 30, 1978

[51] Int. Cl.² ............................................. H05K 3/30
[52] U.S. Cl. ........................................ 29/739; 29/758
[58] Field of Search ................. 29/739, 758, 741, 764, 29/626, 625

[56] References Cited

U.S. PATENT DOCUMENTS

| | | | |
|---|---|---|---|
| 3,538,580 | 11/1970 | Bruner | 29/741 X |
| 3,605,234 | 9/1971 | Bogursky | 29/758 X |
| 3,837,063 | 9/1974 | Wright | 29/739 X |
| 3,946,477 | 3/1976 | Cobaugh et al. | 29/741 |

Primary Examiner—Carl E. Hall
Attorney, Agent, or Firm—J. B. Hoofnagle, Jr.

[57] ABSTRACT

A pin-insertion tool 30 for inserting a replacement pin 12a into a vacant aperture 26a of a wiring board 10 includes a guide member 32 having alignment slots 74 for aligning the tool with a row of in-board pins 12. A pin-insertion member 36 is slidably mounted adjacent to the guide member 32 and includes a pin-retaining means 50 for releasably retaining portion of the replacement pin 12a. The pin-retaining means 50 is positionable in the plane of the alignment slots 74 of the guide member 32 to facilitate insertion of the replacement pin 12a at a uniform orientation with the row of in-board pins 12.

8 Claims, 5 Drawing Figures

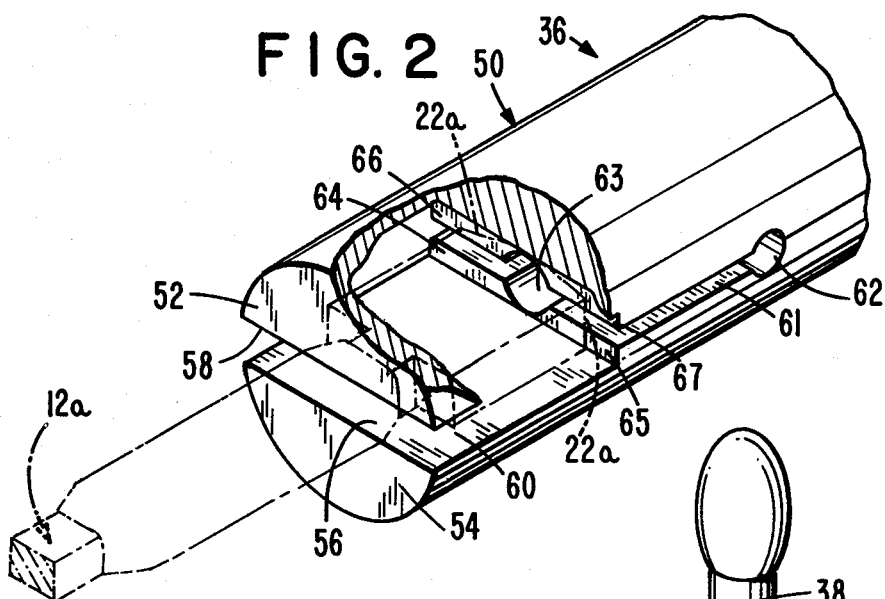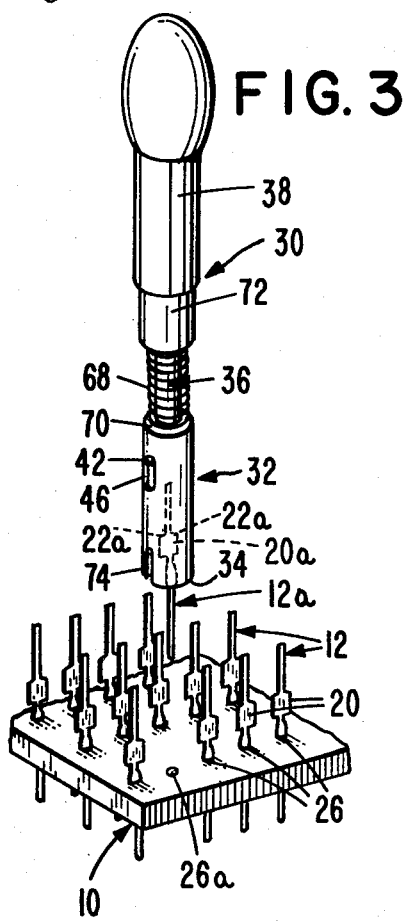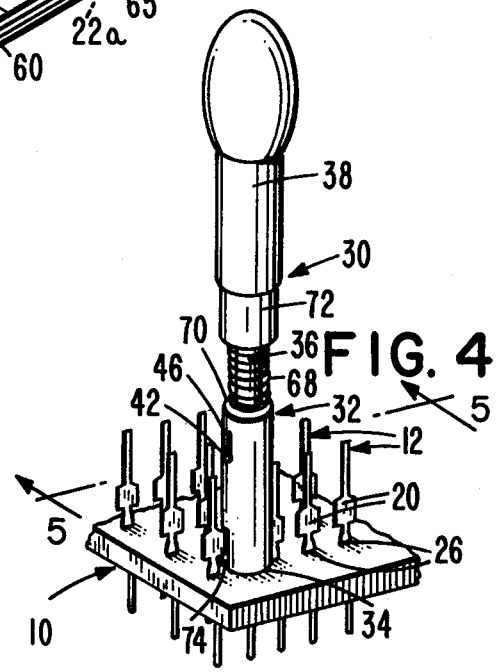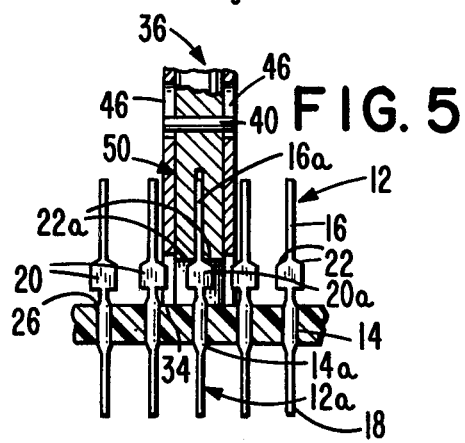

PIN INSERTION TOOL

TECHNICAL FIELD

This invention relates to a pin insertion tool for inserting pins into apertures of a support and particularly to a pin insertion tool for readily inserting the pins at a desired orientation relative to adjacent structures of the support.

BACKGROUND OF THE INVENTION

In some types of electronic equipment used for interconnecting purposes, a plurality of electrical contact pins are inserted into apertures of a support, such as a wiring board, in rows or arrays to form an assembly. It is important that the pins be inserted into the apertures of the board to a uniform depth and in a uniform orientation. Uniform insertion of the contact pins is of particular importance in applications where portions of the inserted pins extend from the surface of the board for subsequent connection with other electrical devices, for example, such as mating connectors or plugs.

Occasionally, one or more of the plurality of pins which have been inserted into the apertures of the board, and which are referred to as in-board pins, may be defective or become damaged and hence must be extracted and replaced with new replacement pins. Frequently, however, there are no other structures other than the in-board pins in the area of the defective or damaged pin. Difficulty then arises in inserting each replacement pin into the board in such a manner that the inserted replacement pin conforms to the uniform depth and orientation of the in-board pins.

One tool heretofore proposed for inserting an electrical contact replacement pin in a wiring board utilizing an electrical housing on the wiring board as a guide, is disclosed in U.S. Pat. No. 4,083,101 which issued to James Ray Coller. In this patent, a plurality of pins are mounted side-by-side into a row of apertures of a wiring board. Each pin includes an intermediate compliant section, a shank extending longitudinally from one end of the compliant section to define one end of the pin, and flattened planar shoulder portions integrally formed with the other end of the compliant section to define an opposite end of the pin. The shoulder portions of the in-board pins extend from one side of the board in planar alignment with one another. The electrical housing is secured to the board with a vertical face of the housing positioned adjacent and parallel to the planar shoulder portions of the in-board pins.

The insertion tool in the Coller patent is of essential rigid one-piece construction and has an elongated rectangular slot at a lower end thereof. The slot receives the shoulder portion of a replacement pin and also receives the shoulder portions of two or more in-board pins on respective opposite sides of the replacement pin during a pin insertion operation.

In preparation to insert the replacement pin into a vacant aperture of the wiring board utilizing the Coller patent, the insertion tool is positioned in engagement with the vertical face of the electrical housing as the shoulder of the replacement pin is received in the slot. The lower end of the tool is initially spaced from surface of the wiring board. When the tool is thus positioned in engagement with the housing, the slot in the lower end of the tool lies in the plane of the shoulder portions of the in-board pins for receiving the shoulder portions of two or more of the above-mentioned in-board pins immediately adjacent to the vacant aperture. The insertion tool then is moved toward the wiring board while slidably engaging the vertical face of the housing until the lower end of the tool engages the board, thereby inserting the replacement pin into a vacant aperture of the board. The housing serves as a guide for insertion tool during the insertion process to maintain the proper orientation of the tool with respect to the board.

U.S. Pat. No. 3,087,235 to J. M. Porter discloses a tool for disengaging terminal leads from a channel or aperture of a connector. The tool includes an outer portion which has an alignment member at one end positionable at a given orientation within portions of the channel of the connector. The tool also includes a cylindrical plunger mounted for axial movement within the outer portion which is used to push the terminal leads out of an opposite end of the connector channel.

U.S. Pat. No. 3,210,836 to B. J. Johanson discloses a retaining tool for gripping or retaining an electrical component. A plunger having resilient legs for gripping the component is mounted for longitudinal movement within an outer sleeve. The plunger is spring biased to a normal position wherein a tapered enlarged head of the resilient legs is seated against an open end of the outer sleeve, forcing the resilient legs in a normally closed or gripping position. As the plunger is moved longitudinally forward, the enlarged head is unseated from the outer sleeve and is expandable to receive the electrical component therebetween. When the plunger is returned to its normal position, the component is gripped within the enlarged head.

U.S. Pat. No. 4,070,755 to C. T. Carter discloses an impacting tool for removing electrical contact elements from connectors on circuit boards. The tool is lowered to the connector or circuit board to receive within an outer sleeve portions of a pin extending from the board. A plunger mounted for axial movement within the sleeve imparts an impacting force on the pin to extract the pin from the board.

U.S. Pat. No. 3,605,234 to R. M. Bogursky teaches a tool for inserting and testing the insertion of a contact pin into a supporting structure. A pair of manually-operable, spring-biased fingers of the tool grips the pin prior to insertion of the pin into an assembly device. After insertion of the pin, and prior to withdrawal of the tool, a test is conducted to insure proper seating of the pin in the supporting structure.

SUMMARY OF THE INVENTION

The present invention relates to a tool for inserting pins into apertures of a support, such as a wiring board. To accomplish the foregoing, the tool includes a guide member having one end facing in a given direction which is positionable adjacent to a surface of the support. The guide member further includes alignment means for aligning the tool with an external facility. A pin-insertion member is mounted for limited axial movement adjacent to the guide member and is provided for inserting a pin into the board. The pin-insertion member includes a pin-retaining means at one end for releasably retaining portions of the pin to be inserted therein.

More specifically, the insertion tool of the present invention can be used to insert a pin into an aperture of a wiring board such that the orientation of the inserted pin will correspond to the orientation of a row of pins previously inserted into the board. The pin-retaining means of the pin-insertion member includes a pair of resilient legs defining a slot for receiving at a given orientation portions of the pin to be inserted. The alignment means of the guide member include at least one slot formed in the walls of the guide member which is provided to align the tool with adjacent structures of the wiring board or external facility. The slot of the pin-retaining means is positionable in the plane of the alignment slot of the guide member so that upon alignment of the guide member with respect to the wiring board, the replacement pin retained within the slot of the pin-retaining means will be positioned at a desired orientation with respect to the wiring board prior to and during the insertion of the replacement.

BRIEF DESCRIPTION OF THE DRAWINGS

FIG. 2 is a partial perspective view showing a pin-retaining portion of the tool of FIG. 1;

FIG. 3 is a perspective view showing a portion of a printed wiring board and an array of shouldered electrical contact pins inserted therein with the pin-insertion tool of FIG. 1 positioned to insert a pin into a vacant aperture of the wiring board;

FIG. 4 is a perspective view showing a portion of the wiring board and the electrical contact pins of FIG. 3 and the position of the insertion tool of FIG. 1 immediately after a pin has been fully inserted; and FIG. 5 is a cross-sectional view taken along the line 5—5 of FIG. 4 and showing the arrangement of internal portions of the tool of FIG. 1, immediately after a pin has been fully inserted into the wiring board.

DETAILED DESCRIPTION

Figure 1:
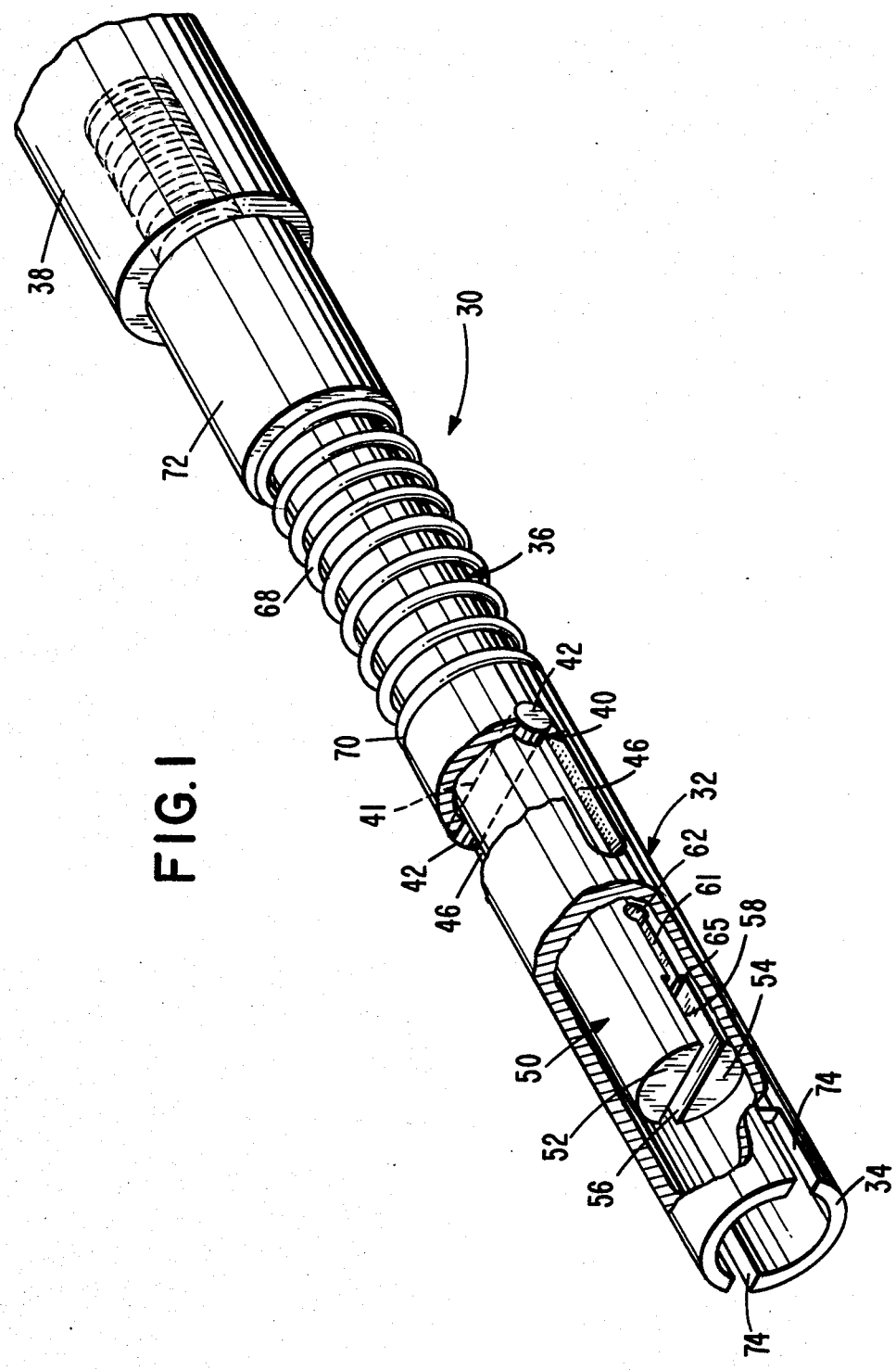
FIG. 1 is a partial perspective view showing a pin-insertion tool in accordance with this invention with portions being broken away to illustrate the internal construction of the tool.

Referring to FIGS. 3, 4 and 5, there is illustrated a support, such as a wiring board, designated generally by the numeral 10, for supporting a plurality of rows of electrical contact pins, designated generally by the numeral 12. As is best shown in FIG. 5, each pin 12 is formed with an intermediate compliant section 14 and upper and lower shank portions 16 and 18, respectively. Each pin 12 also includes a pair of intermediate laterally projecting ears 20 which provide push shoulders 22 for facilitating the insertion of the pin into apertures 26 of the board 10. The in-board pins 12 have been inserted into the board 10 such that the ears 20 of the pins 12 in each row are aligned in the same plane.

As is best shown in FIGS. 3 and 5, when one of the in-board pins 12 is damaged or defective, the damaged or defective pin (not shown) is extracted from the board 10 and is replaced with a replacement pin 12a of identical or similar construction. It is essential that the replacement pin 12a be inserted to conform to the depth and orientation of the in-board pins 12.

Referring to FIG. 1, an insertion tool, designated generally by the numeral 30, in accordance with the invention may be utilized for inserting the replacement pin 12a into a vacant aperture 26a (FIG. 3) of the printed wiring board 10. In this connection, the construction of the insertion tool 30 is such that the replacement pin 12a can be readily inserted into the board 10 with the ears 20a in alignment with the ears 20 of the associated row of the in-board pins 12 and to a depth corresponding to the depth of insertion of the in-board pins.

The insertion tool 30 includes a tubular guide member, designated generally by the numeral 32, of a suitable material, such as tool steel. The insertion tool 30 is formed with a seating end 34 which faces in a given direction and is positionable adjacent to the wiring board 10. A pin-insertion member, designated generally by the numeral 36, which projects longitudinally from a handle 38 and which is threadedly fastened thereto, is mounted for limited axial movement within the guide member 32. A dowel pin, designated generally by the numeral 40, has end portions 42 which project into a pair of opposed longitudinal slots 46 formed in the walls of the guide member 32. The dowel pin 40 is press fitted into an intermediate aperture 41 formed in the pin-insertion member 36 after the alignment of the aperture with the pair of longitudinal slots 46 of the guide member 32. The longitudinal slots 46, having a width which is slightly greater than the diameter of the dowel pin 40, form a keyway for the end portions 42 of the dowel pin, thus permitting axial movement of the pin-insertion member 36 while precluding rotation movement thereof. The ends of longitudinal slots 46 of the guide member 32 limit the axial movement of the pin-insertion member 36 and serve to retain the pin-insertion member within the guide member.

Referring to FIG. 2, the pin-insertion member 36 is formed with a pin-retaining portion, designated generally by the numeral 50, for releasably retaining the replacement pin 12a at a given orientation therein. The pin-retaining portion 50 includes a pair of inwardly biased resilient legs 52 and 54. The resilient legs 52 and 54 have flattened opposed inward faces 56 and 58 which define a lower portion of a stepped slot 60. The face-to-face dimension between the opposed faces 56 and 58 of the lower portion of the stepped slot 60 is slightly smaller than the thickness of the ears 20a of the replacement contact pin 12a. Thus, the resilient legs 52 and 54 will frictionally engage and releasably retain the ears 20a of the replacement pin 12a upon insertion of the ears into the pin-retaining portion 50. An upper portion 61 of the stepped slot 60, which is considerably narrower than the lower portion of the slot, terminates in an annular opening 62 and is provided to enhance the resiliency of the legs 52 and 54. The pin-insertion member 36 is also formed with a passageway 63 along its longitudinal axis in communication with the lower portion of the stepped slot 60 for receiving the upper shank 16a of the replacement pin 12a. Push surfaces 64, 65, 66 and 67 are provided in the plane of the junction of the upper and lower portions of the stepped slot 60 for engaging the shoulders 22a of the replacement pin 12a upon full insertion of the pin 12a within the pin-retaining portion 50 of the pin-insertion member 36.

As is best shown in FIG. 1, a spring 68 extends over an intermediate portion of the pin-insertion member 36 and is captured between an inward end 70 of the guide member 32 and a collar 72 integrally formed on the end of the pin-insertion member adjacent to the handle 38. The resiliency of the spring 68 urges the guide member 32 into a normal position whereby the laterally projecting end portions 42 of the dowel pin 40 are seated in the upper ends of the longitudinal slots 46 as viewed in FIGS. 1 and 3. In this normal position, the pin-retaining portion 50 of the pin-insertion member 36 is recessed within the guide member 32 at the seating end 34.

Alignment means, such as alignment slots 74, are formed in the wall of the guide member 32 and extend axially from the seating end 34 thereof. The alignment slots 74 are provided to align the tool 30 with external facilities such as the adjacent pins 12 of the row of in-board pins which will include the replacement pin 12a. The width of the alignment slots 74 of the guide member 32 is dimensioned slightly greater than the thickness of the ears 20 of the in-board pins 12 to permit the slots to slidably receive in complementary alignment as shown in FIGS. 4 and 5, portions of the ears of the immediately adjacent pins as the guide member 32 is positioned adjacent to the board 10. The length of the alignment slots 74 from the seating end 34 of the guide member 32 is slightly greater than the height of the shoulder 22 of an in-board pin 12 from the surface of the board 10.

The stepped slot 60 of the pin-retaining portion 50 is positioned to lie in the plane of the alignment slots 74 of the guide member 32 when the intermediate aperture 41 of the pin-insertion member 36 is aligned with the longitudinal slots 46 of the guide member. It can be seen that when the dowel pin is properly fitted into the aperture 41, the stepped slot 60 of the pin-retaining portion 50 will remain in planar alignment with the alignment slots 74 of the guide member 32 both prior to and during the insertion of the replacement pin 12a. It should be noted that the arrangement of the aperture 41 of the pin-insertion member 36 and the longitudinal slots 74 of the guide member 32 can be varied to achieve any desired planar orientation of the stepped slot 60 with respect to the alignment slots 74.

To use the tool 30, the upper shank 16a of the replacement pin 12a is first moved into the passageway 63 of the pin-insertion member 36 whereas the ears 20a are moved into the stepped slot 60 of the pin-retaining portion 50. The opposed faces 56 and 58 of the resilient legs 52 and 54 frictionally engage the ears 20a of the replacement pin 12a, thus retaining the pin within the slot 60. When the replacement pin 12a is fully inserted in the stepped slot 60 of the pin-retaining portion 50, the shoulders 22a engage the push surfaces 64, 65, 66 and 67. The compliant section 14a of the replacement pin 12a is fully recessed within the guide member 32 from the seating end 34, whereas portions of the lower shank 18a of the replacement pin extends below the seating end of the guide member as shown in FIG. 3. The tool 30 is then manipulated to position the lower shank 18a of the pin 12a into the vacant aperture 26a of the wiring board 10. As the lower shank 18a is moved into the vacant aperture 26a, the alignment slots 74 of the guide member 32 are positioned directly above and in alignment with one of the shoulders 22 of each of the in-board pins 12 immediately adjacent to the vacant aperture.

As the tool 30 is moved toward the board 10 to insert the replacement pin 12a, the alignment slots 74 of the guide member 32 receive one shoulder 22 of each of the immediately adjacent in-board pins 12 in complementary alignment and consequently the replacement pin 12a retained in the pin-retaining portion 50 is automatically aligned with the shoulders 22 of these adjacent in-board pins. In addition, once the shoulders 22 are located within the alignment slots 74 of the guide member 32, the tool 30 is precluded from rotation prior to or during the insertion of the replacement pin 12a.

The tool 30 is then manipulated to move the pin-insertion member 36 downwardly against the biasing action of the spring 68 until the free end of the pin-retaining portion 50 engages the surface of the board 10 as shown in FIG. 5. As the pin-insertion member 36 is moved downwardly, the compliant section 14a of the replacement pin 12a frictionally engages the wall of the aperture 26a of the board 10. As illustrated in FIG. 5, the depth dimension of the slot 60 is greater than the axial dimension of the ears 20a so that, when the pin-retaining portion 50 seats on the board 10, the ears 20a are spaced from the board the same distance as the ears 20 of the in-board pins 12. Thus, the pin 12a is inserted into the board 10 at the uniform depth of the in-board pins 12. The compliant section 14a of the replacement pin 12a is retained within the aperture 26a by a retention force of sufficient magnitude to overcome the frictional engagement of the replacement pin within the pin-retaining portion 50 of the pin-insertion member 36. The replacement pin 12a will remain in the aperture 26a of the board 10 as the tool 30 is withdrawn from the board.

The handle 38 of the tool 30 can be of a well-known impacting variety having an internal spring mechanism (not shown) which, after some downward movement of the tool, imparts an instantaneous impacting force on the pin-insertion member 36. The impacting force is of sufficient magnitude to cause the pin-insertion member 36 to move the pin-insertion member longitudinally downwardly (FIG. 4) against the resistance of the spring 68 and the frictional resistance of the compliant section 14a and the aperture 26a (FIG. 5) to insert the replacement pin 12a.

In summary, the tool 30 facilitates the insertion of an electrical contact pin, such as the replacement pin 12a, into a support, such as the printed wiring board 10, to a desired orientation and depth. The pin-insertion tool 30 grips the replacement pin 12a within the pin-retaining portion 50 of the pin-insertion member 36 prior to and during insertion of the pin into the vacant aperture 26a of the board 10. As the guide member 36 is moved toward the board 10, portions of the ears 20 of the immediately adjacent in-board pins 12 are located within the alignment slots 74. The replacement pin 12a is thereby in planar alignment with the in-board pins 12 and the tool 30 is prevented from rotating during the ultimate insertion of the replacement pin. Upon application of a downward force on the pin-insertion member 36, the replacement pin 12a then is inserted into the aperture 26a in the board 10 to a desired depth. Thus, upon insertion of the replacement pins 12a into the vacant aperture 26a in the board 10 by use of the tool 30, the replacement pins will conform to the orientation and depth of the in-board pins 12 previously inserted into the board. While the impact handle 38 provides an assist during application of the downward force upon the pin-insertion member 36, the insertion of the pins 12a into the apertures 26a can be accomplished without the use of the impact handle.

It is to be understood that the above-described embodiments are simply illustrative of this invention. Other embodiments may be devised by those skilled in the art which will embody the principles of the invention and fall within the spirit and scope thereof.

I claim:

1. A pin insertion tool for inserting a pin into an aperture of a support, comprising:

a guide member having one end facing in a given direction;

means, formed with said guide member and moved into complementary alignment with an external facility when the tool is moved toward the aperture in the support, for aligning the tool with the external facility;

a pin-insertion member;

means for mounting said pin-insertion member adjacent to said guide member and for permitting limited movement of said pin-insertion member relative to said guide member, said pin-insertion member having one end facing in the given direction; and a pin-retaining means formed with and at the one end of the pin-insertion member for releasably retaining at least a portion of a pin therein.

2. A pin-insertion tool as set forth in claim 1, wherein said pin-retaining means includes a pair of opposed inwardly biased resilient legs defining a slot for releasably retaining portions of the pin.

3. A pin-insertion tool as set forth in claim 2, wherein the pin includes two shank portions extending in opposed axial directions and a pair of laterally projecting ears formed at the juncture of the two shank portions, said laterally projecting ears being positionable within said slot of said pin retaining means, and wherein the pin-insertion member includes a passageway adjacent to said pin-retaining means for receiving one of the shank portions of the pin as the laterally projecting ears are positioned within said slot of said pin-retaining means.

4. A pin-insertion tool for inserting a pin into an aperture of a support, comprising:

a tubular guide member having one end facing in a given direction;

means, formed with said tubular guide member and moved into complementary alignment with an external facility when the tool is moved toward the aperture in the support, for aligning the tool with the external facility;

a pin-insertion member contained and slidably mounted for limited axial movement within said tubular guide member, said pin-insertion member having one end facing in the given direction; and a pin-retaining means formed with and at the one end of the pin-insertion member for releasably retaining at least a portion of a pin therein.

5. A pin-insertion tool as set forth in claim 4, wherein said aligning means is at least one slot formed in a wall of said tubular guide member, said slot extending from the one end of said guide member.

6. A pin-insertion tool as set forth in claim 5, wherein said pin-retaining means includes a pair of opposed inwardly biased resilient legs defining a slot for releasably retaining portions of the pin therein; and which further comprises:

means for positioning said slot of said pin-retaining means in a desired orientation with respect to said guide member slot and for maintaining said slot of said pin-retaining means in the desired orientation during movement of the pin-insertion member relative to the guide member.

7. A pin-insertion tool as set forth in claim 6, wherein the means for positioning and for maintaining said slot of said pin-retaining means includes:

an elongated aperture formed in the wall of the said tubular guide member in a direction parallel to the direction of movement of said pin-insertion member; and a dowel pin extending laterally from an intermediate portion of said pin-insertion member and into said aperture of said guide member, the side walls of the aperture being spaced apart by a distance slightly greater than the thickness of the dowel pin to permit slidable movement of the dowel pin within said aperture upon movement of said pin-insertion member relative to said guide member.

8. A pin-insertion tool as set forth in claim 4, which further comprises resilient means cooperating with portions of said guide member and with portions of said pin-insertion member to urge said pin-insertion member to a normal position wherein the pin-retaining means of said pin-insertion member is recessed within the one end of said tubular guide member.

* * * * *